United States Patent
Morokuma et al.

(10) Patent No.: US 12,537,436 B2
(45) Date of Patent: Jan. 27, 2026

(54) POWER SEMICONDUCTOR ELEMENT DRIVE ADJUSTMENT CIRCUIT, POWER MODULE, AND POWER CONVERSION DEVICE

(71) Applicant: Mitsubishi Electric Corporation, Tokyo (JP)

(72) Inventors: Kenichi Morokuma, Tokyo (JP); Yoshiko Tamada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 269 days.

(21) Appl. No.: 18/563,920

(22) PCT Filed: Jun. 1, 2021

(86) PCT No.: PCT/JP2021/020785
§ 371 (c)(1),
(2) Date: Nov. 24, 2023

(87) PCT Pub. No.: WO2022/254569
PCT Pub. Date: Dec. 8, 2022

(65) Prior Publication Data
US 2024/0275265 A1    Aug. 15, 2024

(51) Int. Cl.
*H02M 1/08*    (2006.01)
*H02M 1/00*    (2006.01)
*H02M 1/32*    (2007.01)

(52) U.S. Cl.
CPC ........... *H02M 1/08* (2013.01); *H02M 1/0009* (2021.05); *H02M 1/325* (2021.05)

(58) Field of Classification Search
CPC ...... H02M 1/08; H02M 1/0009; H02M 1/325; H03K 17/042; H03K 17/168; H03K 2217/0027; H03K 2217/0036
See application file for complete search history.

(56) References Cited

U.S. PATENT DOCUMENTS 10,461,732 B1    10/2019  Norling et al.
11,316,513 B2 *   4/2022  Zhang .................. H03K 17/165
(Continued)

FOREIGN PATENT DOCUMENTS

JP       3132648 B2      2/2001
JP    2002-369553 A    12/2002
(Continued)

OTHER PUBLICATIONS

International Search Report and Written Opinion mailed on Aug. 10, 2021, received for PCT Application PCT/JP2021/020785, filed on Jun. 1, 2021, 10 pages including English Translation.

*Primary Examiner* — Kyle J Moody
(74) *Attorney, Agent, or Firm* — XSENSUS LLP

(57) ABSTRACT

A power semiconductor element drive adjustment circuit is provided with a difference unit to calculate a difference value between a normalized value of the differential value of the collector-emitter voltage and a normalized value of the differential value of the collector current, a comparison unit to compare the difference value with a comparison reference value, a drive control unit to generate, on the basis of a comparison result of the comparison unit, a drive adjustment signal that adjusts a drive signal for the power semiconductor element, and a drive variable circuit to output, on the basis of the drive adjustment signal, the drive signal for the power semiconductor element.

11 Claims, 13 Drawing Sheets

(56) References Cited

U.S. PATENT DOCUMENTS

| | | | |
|---|---|---|---|
| 12,132,472 B2 * | 10/2024 | Yamamoto | H03K 17/145 |
| 2017/0104479 A1 | 4/2017 | Kanamori et al. | |
| 2018/0159521 A1 * | 6/2018 | Tsurumaru | H03K 17/166 |
| 2021/0028702 A1 * | 1/2021 | Morokuma | H02M 3/158 |

FOREIGN PATENT DOCUMENTS

| | | |
|---|---|---|
| JP | 6187428 B2 | 8/2017 |
| JP | 2019-220955 A | 12/2019 |

* cited by examiner

POWER SEMICONDUCTOR ELEMENT DRIVE ADJUSTMENT CIRCUIT, POWER MODULE, AND POWER CONVERSION DEVICE

CROSS-REFERENCE TO RELATED APPLICATION

This application is based on PCT filing PCT/JP2021/020785, filed Jun. 1, 2021, the entire contents of which are incorporated herein by reference.

TECHNICAL FIELD

The present disclosure relates to a power semiconductor element drive adjustment circuit, a power module, and a power conversion device.

BACKGROUND ART

A power semiconductor element that controls a high power is used in a power supply circuit that generates alternating currents of different frequencies from direct currents or alternating currents, a power conversion device that includes such a circuit, or a like. When the power semiconductor element is used in the power conversion device or the like, it is important to suppress power consumption in order to reduce greenhouse gases. A method is known for reducing energy generated in the power semiconductor element by controlling the power semiconductor element.

For example, the method of driving the power semiconductor element of PTL 1 includes driving the power semiconductor element by a gate drive signal, measuring at least one of a derivative of a load path voltage and a derivative of a load path current of the power semiconductor element, measuring a derivative of the gate drive signal, forming an error signal on the basis of a reference signal, the measured derivative of the gate drive signal, and at least one of the measured derivative of the voltage of the load path of the power semiconductor element and the measured derivative of the load path current of the power semiconductor element, and forming the gate drive signal. Forming the gate drive signal includes processing the error signal by using a dynamic controller.

CITATION LIST

Patent Literature

PTL 1: Japanese Patent Laying-Open No. 2019-220955

SUMMARY OF INVENTION

Technical Problem

A loss that is generated in the power semiconductor element is expressed by a product of the load path voltage and current. It is possible to reduce the loss by controlling either one of the load path voltage or current. However, since the loss and a noise are in a trade-off relationship, if only either one of the load path voltage or current of the semiconductor element is controlled, a characteristic of only one of the loss and the noise can be improved. For example, if the loss is improved, a noise characteristic may be deteriorated, and conversely, if the noise is improved, the loss may be deteriorated.

The device described in PTL 1 adjusts a gate signal individually by using a differential value of the voltage or the current. If the differential value of the voltage or the differential value of the current is reduced for noise reduction, the loss increases.

An object of the present disclosure is to provide a power semiconductor element drive adjustment circuit, a power module, and a power conversion device capable of reducing both a loss and a noise generated in the power semiconductor element.

Solution to Problem

A power semiconductor element drive adjustment circuit of the present disclosure is provided with a voltage detection unit to detect a collector-emitter voltage of a power semiconductor element, a current detection unit to detect a collector current of the power semiconductor element, a differentiating unit to differentiate the collector-emitter voltage and differentiate the collector current, a normalizing unit to normalize a differential value of the collector-emitter voltage and normalize a differential value of the collector current, a difference unit to calculate a difference value between a normalized value of the differential value of the collector-emitter voltage and a normalized value of the differential value of the collector current, a comparison unit to compare the difference value with a comparison reference value, a drive control unit to generate, on the basis of a comparison result of the comparison unit, a drive adjustment signal for adjusting a drive signal for the power semiconductor element, and a drive variable circuit to output, on the basis of the drive adjustment signal, the drive signal for the power semiconductor element.

Advantageous Effects of Invention

The power semiconductor element drive adjustment circuit of the present disclosure compares the difference value between the normalized value of the differential value of the collector-emitter voltage and the normalized value of the differential value of the collector current with the comparison reference value, and generates the drive adjustment signal for adjusting the drive signal for the power semiconductor element on the basis of the comparison result. As a result, the power semiconductor element drive adjustment circuit of the present disclosure can reduce both a loss and a noise generated in the power semiconductor element.

DESCRIPTION OF EMBODIMENTS

Figure 1:
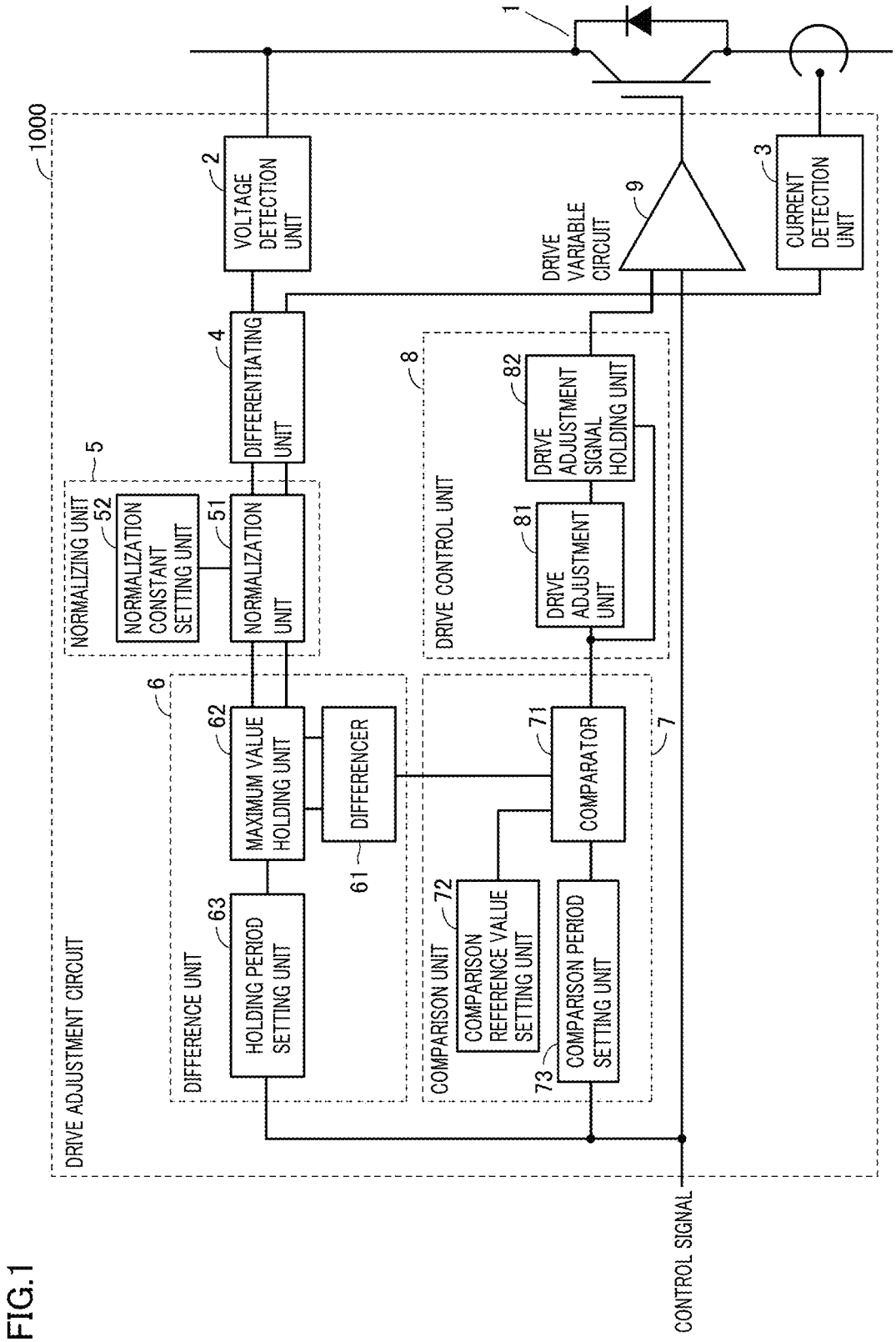
FIG. 1 is a diagram showing a configuration of a drive adjustment circuit 1000 of a power semiconductor element 1 according to a first embodiment.

With reference to the drawings, embodiments will be described below. In the following embodiments, the same reference numerals are attached to the same components.

First Embodiment

FIG. 1 is a diagram showing a configuration of a drive adjustment circuit 1000 of a power semiconductor element 1 according to a first embodiment. Drive adjustment circuit 1000 is provided with a voltage detection unit 2, a current detection unit 3, a differentiating unit 4, a normalizing unit 5, a difference unit 6, a comparison unit 7, a drive control unit 8, and a drive variable circuit 9.

Voltage detection unit 2 detects a collector-emitter voltage of power semiconductor element 1. Voltage detection unit 2 is composed of, for example, a resistance voltage dividing circuit, and the like.

Current detection unit 3 detects a collector current of power semiconductor element 1. Current detection unit 3 is composed of, for example, a shunt resistor or a sense cell included in power semiconductor element 1, and the like.

Differentiating unit 4 differentiates the collector-emitter voltage of power semiconductor element 1, which is a detection result of voltage detection unit 2. Differentiating unit 4 differentiates the collector current of power semiconductor element 1, which is a detection result of current detection unit 3. Differentiating unit 4 may be composed of, for example, a capacitor and a resistor, or may be composed of the capacitor, the resistor, and an operational amplifier.

Normalizing unit 5 normalizes a differential value of the collector-emitter voltage of power semiconductor element 1. Normalizing unit 5 normalizes a differential value of the collector current of power semiconductor element 1. Normalizing unit 5 is provided with a normalization constant setting unit 52 and a normalization unit 51.

Normalization constant setting unit 52 sets normalization constants $\alpha 1$ and $\alpha 2$.

Normalization unit 51 normalizes the differential value of the collector-emitter voltage of power semiconductor element 1 on the basis of normalization constant $\alpha 1$. Normalization unit 51 normalizes the differential value of the collector current of power semiconductor element 1 on the basis of normalization constant $\alpha 2$.

Normalization constant setting unit 52 can set normalization constants $\alpha 1$ and $\alpha 2$ to arbitrary values. For example, if power semiconductor element 1 operates at a voltage of 1200 V and a current of 100 A and a change time in turn-on operations of the voltage and the current is a same time dt, the differential value (a change amount) of the voltage is 1200 V/dt and the differential value (the change amount) of the current is 100 A/dt. These values are remarkably different from each other. In the present embodiment, normalization constant setting unit 52 sets normalization constants $\alpha 1$ and $\alpha 2$ to the arbitrary values. Thereby, it is possible to reduce a difference between the change amount per unit time of the collector-emitter voltage of power semiconductor element 1 and the change amount per unit time of the collector current of power semiconductor element 1.

Difference unit 6 subtracts a maximum value of a normalized value of the differential value of the collector-emitter voltage of power semiconductor element 1 from a maximum value of a normalized value of the differential value of the collector current of power semiconductor element 1.

Difference unit 6 is provided with a differencer 61, a maximum value holding unit 62, and a holding period setting unit 63.

Holding period setting unit 63 sets a period during which the maximum value of the normalized value is held on the basis of a control signal.

Maximum value holding unit 62 holds the maximum value of the normalized value of the differential value of the collector-emitter voltage of power semiconductor element 1 and the maximum value of the normalized value of the differential value of the collector current of power semiconductor element 1, which are output from normalizing unit 5, from a start time of a holding period set by holding period setting unit 63 to a current time, and outputs a held result to differencer 61. Maximum value holding unit 62 is composed of, for example, a switch, the capacitor, and the like.

Differencer 61 generates a difference value between two signals output from maximum value holding unit 62. In other words, differencer 61 subtracts the maximum value of the normalized value of the differential value of the collector-emitter voltage of power semiconductor element 1 from the maximum value of the normalized value of the differential value of the collector current of power semiconductor element 1, and outputs the difference value. Differencer 61 is composed of, for example, the operational amplifier, the resistor, and the like.

Comparison unit 7 compares the difference value output from difference unit 6 with a comparison reference value. Comparison unit 7 is provided with a comparator 71, a comparison reference value setting unit 72, and a comparison period setting unit 73.

Comparison period setting unit 73 sets a period during which comparator 71 makes a comparison on the basis of the control signal.

Comparison reference value setting unit 72 sets the comparison reference value.

Comparator 71 compares the difference value output from difference unit 6 with the comparison reference value set by comparison reference value setting unit 72 in a comparison period set by comparison period setting unit 73.

On the basis of a comparison result of comparison unit 7, drive control unit 8 outputs a signal for adjusting a drive signal for power semiconductor element 1, thereby controlling a voltage change (dVce/dt) in the collector-emitter voltage of power semiconductor element 1 and a current change (dIc/dt) in the collector current of power semiconductor element 1.

Drive control unit 8 is provided with a drive adjustment unit 81 and a drive adjustment signal holding unit 82.

On the basis of the comparison result of the comparison unit 7, drive adjustment unit 81 outputs a drive adjustment signal for controlling the drive signal for power semiconductor element 1.

On the basis of the comparison result of the comparison unit 7, drive adjustment signal holding unit 82 holds the drive adjustment signal generated by drive adjustment unit 81.

Drive variable circuit 9 generates the drive signal for driving power semiconductor element 1 on the basis of the drive adjustment signal generated by drive control unit 8. On the basis of the drive adjustment signal generated by drive control unit 8, drive variable circuit 9 transiently controls the drive signals for power semiconductor element 1 at the time of the turn-on and at the time of the turn-off, thereby controlling the voltage change (dVce/dt) in the collector-emitter voltage of power semiconductor element 1 and the current change (dIc/dt) in the collector current of power semiconductor element 1. Drive variable circuit 9 is composed of one or more output transistors, a current source, a gate resistor, and the like.

Figure 2:
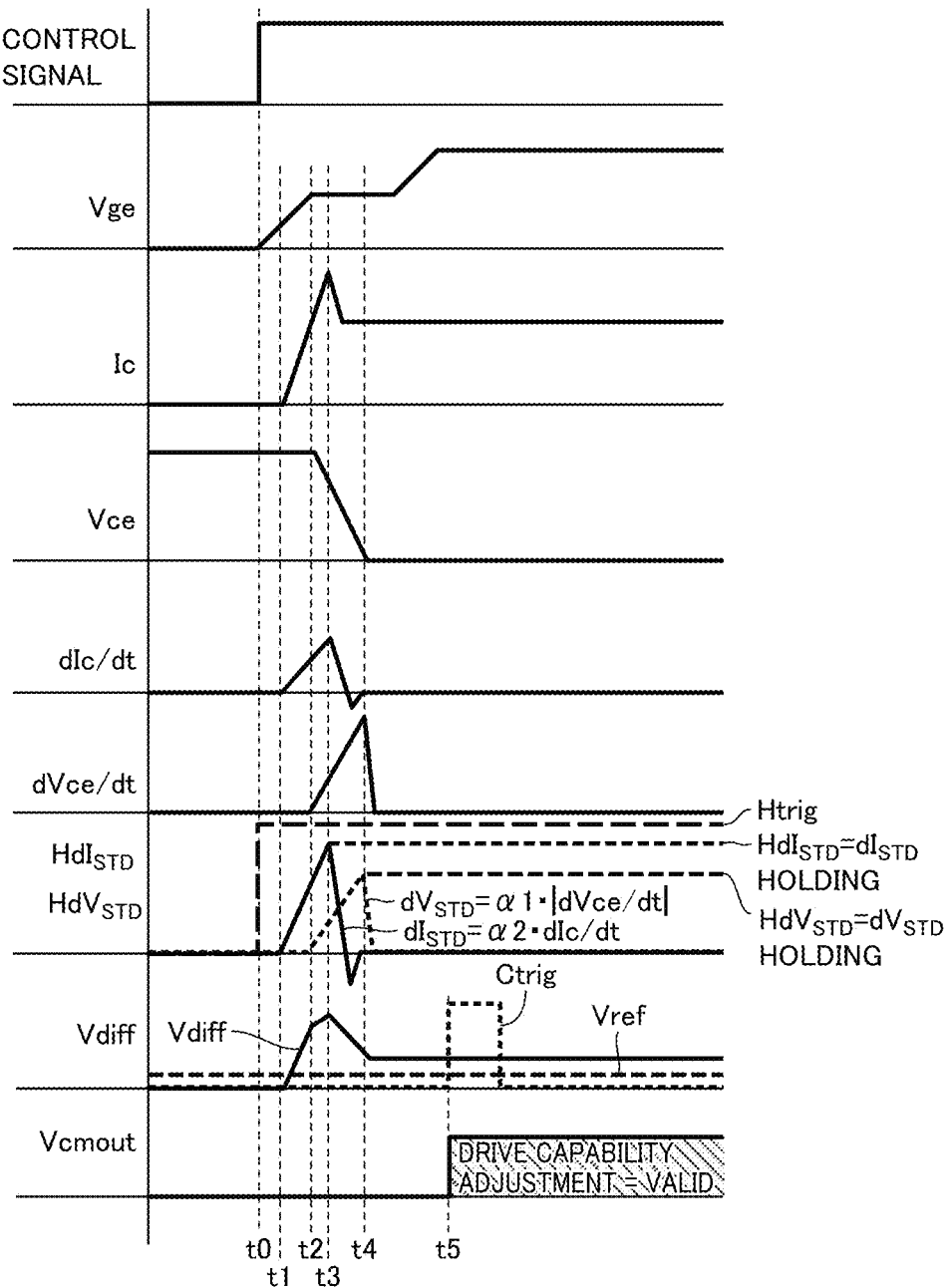
FIG. 2 is a diagram for explaining an operation of drive adjustment circuit 1000 of power semiconductor element 1 when power semiconductor element 1 is turned on in the first embodiment.

FIG. 2 is a diagram for explaining an operation of the drive adjustment circuit 1000 of power semiconductor element 1 when power semiconductor element 1 is turned on in the first embodiment.

Vge is the drive signal for driving power semiconductor element 1. Ic is the collector current of power semiconductor element 1 detected by current detection unit 3. Vce is the collector-emitter voltage of power semiconductor element 1 detected by voltage detection unit 2. dIc/dt is the differential value of collector current Ic output from differentiating unit 4. dVce/dt is the differential value of collector-emitter voltage Vce output from differentiating unit 4.

dVSTD is the normalized value of dVce/dt output from normalizing unit 5. |dVce/dt| is an absolute value of dVce/dt. dISTD is the normalized value of dIc/dt output from normalizing unit 5.

Htrig is a holding period setting signal output from holding period setting unit 63 of difference unit 6. When Htrig reaches a high level, maximum value holding unit 62 holds a maximum value of an output signal of normalizing unit 5 after Htrig has reached the high level. Htrig is generated on the basis of the control signal. The holding period ends when Htrig is lowered to a low level at an arbitrary timing.

HdISTD is the maximum value of dISTD held by maximum value holding unit 62.

HdVSTD is the maximum value of dVSTD held by maximum value holding unit 62.

Vdiff is an output of differencer 61 of difference unit 6. In other words, Vdiff is the difference value between dISTD and dVSTD.

Vref is the comparison reference value set by comparison reference value setting unit 72 of comparison unit 7.

Ctrig is a comparison period setting signal output from comparison period setting unit 73 of comparison unit 7. When Ctrig reaches the high level, comparator 71 compares Vdiff with Vref and outputs the comparison result thereof.

Vcmout is an output signal of comparator 71 of comparison unit 7. When Vcmout is at the high level, drive control unit 8 adjusts the drive signal for power semiconductor element 1, and outputs the adjusted signal that is held by drive adjustment signal holding unit 82. When Vcmout is at the low level, drive control unit 8 considers that adjustment has already been made to a set desired characteristic, and continues, without adjusting the drive signal, holding the adjustment signal held by drive adjustment signal holding unit 82 when Vcmout is at the high level.

Next, an operation of drive adjustment circuit 1000 of power semiconductor element 1 of the first embodiment will be described by using FIG. 2.

At a time t0, when the control signal is switched from the low level to the high level, drive variable circuit 9 is operated so that signal Vge for driving power semiconductor element 1 starts to rise. Holding period setting unit 63 of difference unit 6 switches Htrig from the low level to the high level on the basis of the switching of the control signal to the high level. As a result, maximum value holding unit 62 starts to hold the maximum values of the output signals (dVSTD, dISTD) of normalizing unit 5.

At a time t1, when Vge exceeds a threshold voltage Vth of power semiconductor element 1, collector current Ic of power semiconductor element 1 starts to flow. Ic detected by current detection unit 3 is differentiated by differentiating unit 4. dIc/dt, which is a differential result, starts to rise. dIc/dt is normalized on the basis of normalization constant $\alpha 2$ set by normalization constant setting unit 52 of normalizing unit 5. Output signal dISTD of normalizing unit 5 starts to rise. Maximum value HdISTD of output signal dISTD of normalizing unit 5 increases.

Differencer 61 outputs difference value Vdiff between the outputs (HdVSTD, HdISTD) held by maximum value holding unit 62.

At a time t2, when Vge enters a mirror period, collector-emitter voltage Vce of power semiconductor element 1 starts to change. Vce detected by voltage detection unit 2 is differentiated by differentiating unit 4. dVce/dt, which is the differential result, starts to rise. dVce/dt is normalized on the basis of normalization constant $\alpha 1$ set by normalization constant setting unit 52 of normalizing unit 5. Output signal dVSTD of normalizing unit 5 starts to rise. Maximum value HdVSTD of output signal dVSTD of normalizing unit 5 increases. Differencer 61 outputs difference value Vdiff between the outputs (HdVSTD, HdISTD) held by maximum value holding unit 62 continuously from time to.

At a time t3, collector current Ic starts to decrease. As a result, dIc/dt and dISTD decrease. Output signal HdISTD of maximum value holding unit 62 does not change.

At a time t4, the change in collector-emitter voltage Vce ends. As a result, dVce/dt decreases. Output signal HdVSTD of maximum value holding unit 62 does not change.

At a time t5, comparison period setting unit 73 of comparison unit 7 increases comparison period setting signal Ctrig from the low level to the high level at a preset timing after the changes of collector-emitter voltage Vce and collector current Ic have ended on the basis of the control signal, so that an operation of comparator 71 is valid. Since Ctrig has reached the high level, comparator 71 compares input signal Vdiff to comparator 71 with comparison reference value Vref set by comparison reference value setting unit 72, and outputs the comparison result. In the description of the operation of the first embodiment, since difference value Vdiff of differencer 61 is larger than comparison reference value Vref, comparison result Vcmout of comparator 71 increases from the low level to the high level. As a result, adjustment of the drive signal for power semiconductor element 1 is valid, drive adjustment unit 81 of drive control unit 8 generates the adjustment signal to drive variable circuit 9, and drive adjustment signal holding unit 82 holds and outputs the adjustment signal. When comparison result Vcmout of comparator 71 is at the low level, drive adjustment unit 81 considers that the adjustment has already been made to the set desired characteristics and disables the adjustment of the drive signal. Then, drive adjustment signal holding unit 82 continues holding, as it is, the adjustment signal held when Vcmout is at the high level.

Figure 3:
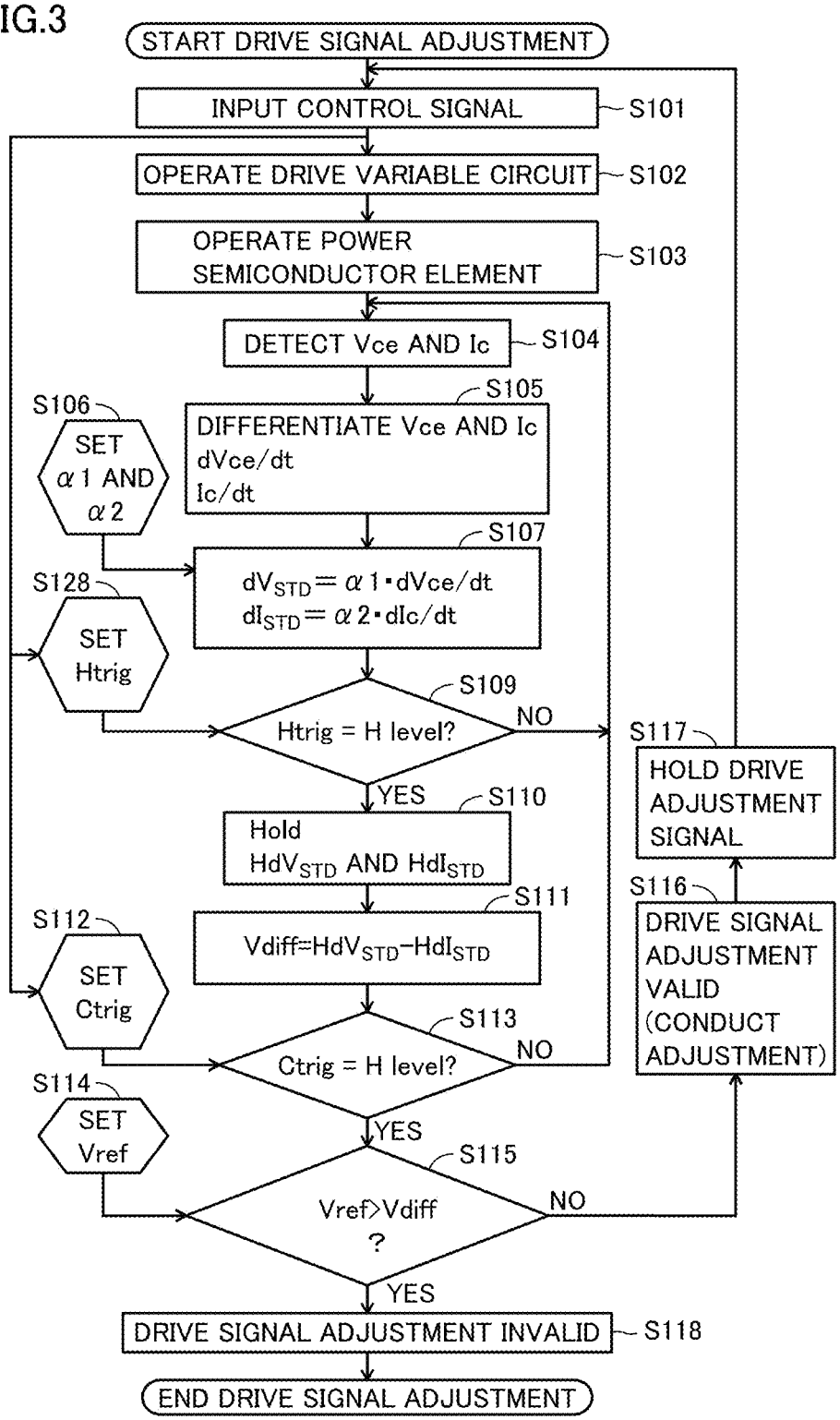
FIG. 3 is a flowchart showing the operation of drive adjustment circuit 1000 of power semiconductor element 1 of the first embodiment.

FIG. 3 is a flowchart showing the operation of drive adjustment circuit 1000 of power semiconductor element 1 of the first embodiment.

In step S101, when the adjustment of the drive signal is started, the control signal is inputted.

In step S102, drive variable circuit 9 is operated on the basis of the input of the control signal, and outputs the drive signal for driving power semiconductor element 1.

In step S103, power semiconductor element 1 is operated on the basis of the drive signal of drive variable circuit 9. This causes collector current Ic and collector-emitter voltage Vce to change.

In step S104, voltage detection unit 2 detects Vce that changes in accordance with the operation of power semiconductor element 1. Current detection unit 3 detects Ic that changes in accordance with the operation of power semiconductor element 1.

In step S105, differentiating unit 4 differentiates each of the detected Vce and Ic.

In step S106, normalization constant setting unit 52 sets values of normalization constants α1 and α2.

In step S107, normalization unit 51 normalizes the differential value (dVce/dt) and the differential value (dIc/dt) on the basis of normalization constants α1 and α2 as follows.

$$dVSTD = \alpha 1 \cdot dVce/dt \ldots \quad (1)$$

$$dISTD = \alpha 2 \cdot dIc/dt \ldots \quad (2)$$

In step S108, holding period setting unit 63 sets holding period setting signal Htrig to be valid (the high level) on the basis of the control signal.

In step S109, if holding period setting signal Htrig is valid (at the high level), the process proceeds to step S110. If holding period setting signal Htrig is invalid (at the low level), the process returns to step S104.

In step S110, maximum value holding unit 62 holds maximum value HdVSTD of dVSTD and maximum value HdISTD of dISTD.

In step S111, differencer 61 subtracts HdVSTD from HdISTD and outputs difference value Vdiff.

In step S112, comparison period setting unit 73 sets comparison period setting signal Ctrig to be valid (at the high level) on the basis of the control signal.

In step S113, if comparison period setting signal Ctrig is valid (at the high level), the process proceeds to step S115. If comparison period setting signal Ctrig is invalid (at the low level), the process returns to step S104.

In step S114, comparison reference value setting unit 72 sets comparison reference value Vref.

In step S115, comparator 71 compares difference value Vdiff with comparison reference value Vref, and outputs the comparison result. If comparison reference value Vref is difference value Vdiff or less, the process proceeds to step S116. If comparison reference value Vref is larger than difference value Vdiff, the process proceeds to step S118.

In step S116, drive adjustment unit 81 generates the drive adjustment signal for adjusting the drive signal of drive variable circuit 9.

In step S117, drive adjustment signal holding unit 82 holds the drive adjustment signal. After that, the process returns to step S101, and the drive adjustment is started again.

In step S118, drive adjustment unit 81 does not generate the drive adjustment signal for adjusting the drive signal of drive variable circuit 9, and the adjustment of the drive signal ends. Power semiconductor element 1 is operated, in accordance with the input of the control signal, by the drive signal of drive variable circuit 9 on the basis of the drive adjustment signal held by drive adjustment signal holding unit 82.

As described above, the drive adjustment circuit of the first embodiment compares the difference value between the normalized value of the differential value of the collector-emitter voltage of power semiconductor element 1 and the normalized value of the differential value of the collector current thereof with the comparison reference value in the turn-on operation or a turn-off operation of power semiconductor element 1. By using the comparison result, the drive adjustment circuit controls each of the voltage change (dVce/dt) in the collector-emitter voltage of power semiconductor element 1 and the current change (dIc/dt) in the collector current of power semiconductor element 1 while considering a balance therebetween. This makes it possible to reduce both a loss and a noise. The drive adjustment circuit can also preferentially reduce either of the noise or the loss by adjusting the comparison reference value.

Second Embodiment

Figure 4:
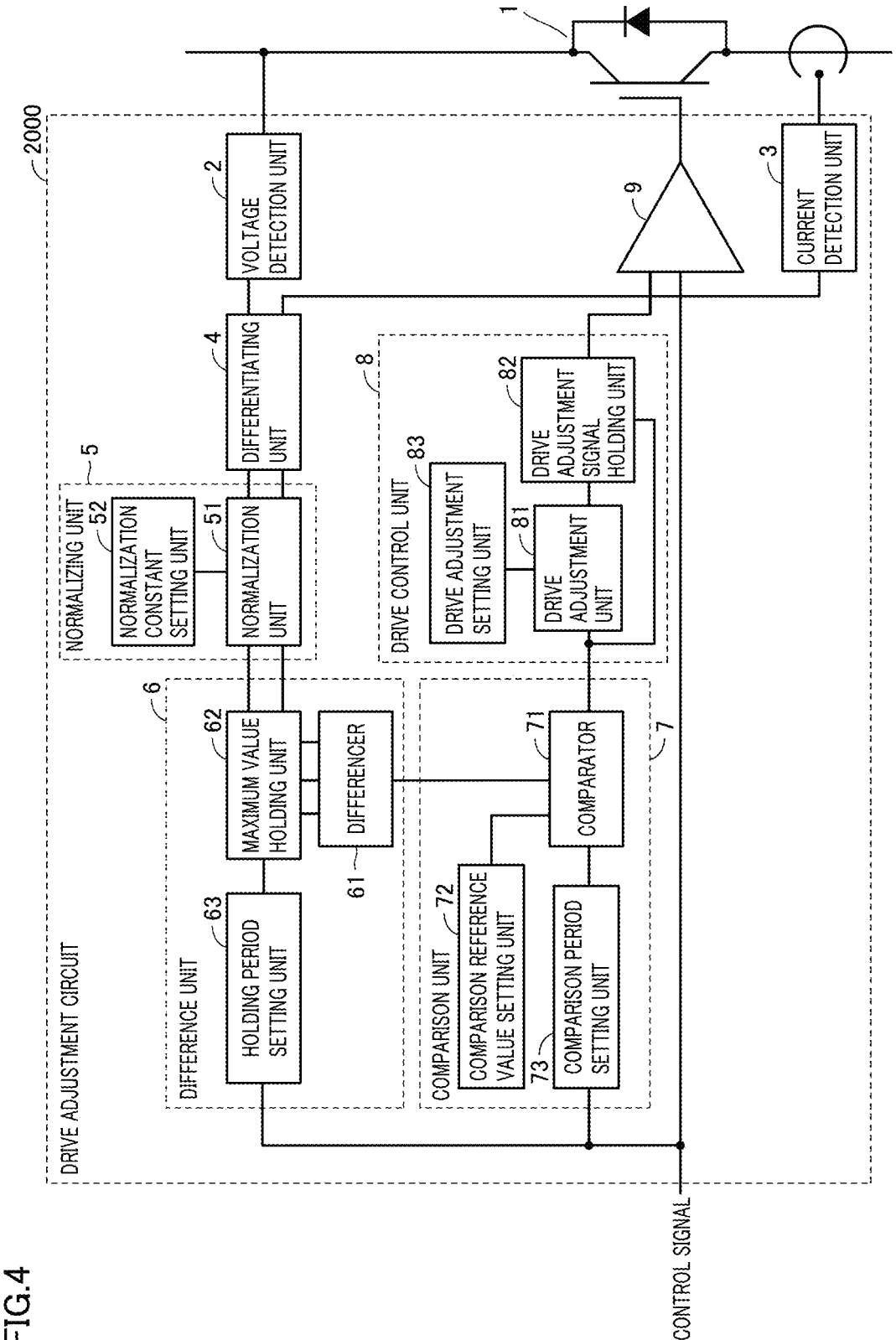
FIG. 4 is a diagram showing a configuration of a drive adjustment circuit 2000 of power semiconductor element 1 according to a second embodiment.

FIG. 4 is a diagram showing a configuration of a drive adjustment circuit 2000 of power semiconductor element 1 according to a second embodiment. The difference between drive adjustment circuit 2000 shown in FIG. 4 and drive adjustment circuit 1000 of the first embodiment shown in FIG. 1 is as follows.

Drive control unit 8 of drive adjustment circuit 2000 in FIG. 4 is provided with a drive adjustment setting unit 83.

In drive adjustment circuit 1000 of the first embodiment, both the voltage change (dVce/dt) in the collector-emitter voltage of power semiconductor element 1 and the current changes (dIc/dt) in the collector current of power semiconductor element 1 are adjusted in accordance with the result of the comparison unit 7.

In drive adjustment circuit 2000 of the second embodiment, drive adjustment setting unit 83 sets which of the voltage change (dVce/dt) in the collector-emitter voltage of power semiconductor element 1 or the current change (dIc/dt) in the collector current of power semiconductor element 1 is to be adjusted by drive adjustment unit 81 in the turn-on operation or the turn-off operation of power semiconductor element 1. If the characteristics valid for reducing the loss and the noise are known in advance, the number of trials for adjusting the drive signal can be reduced by setting the characteristics to be adjusted by drive adjustment setting unit 83. For example, if the characteristics valid for reducing the loss and the noise are the current change (dIc/dt) in the collector current of power semiconductor element 1 in the turn-on operation and is the voltage change (dVce/dt) in the collector-emitter voltage of power semiconductor element 1 in the turn-off operation, drive adjustment setting unit 83 sets the characteristic to be adjusted in the turn-on operation to the current change (dIc/dt) in the collector current of power semiconductor element 1 and sets the characteristic to be adjusted in the turn-off operation to the voltage change (dVce/dt) in the collector-emitter voltage of power semiconductor element 1. As a result, since the number of characteristics to be adjusted is reduced from two to one, the number of trials for adjusting the drive signal can be reduced as compared with drive adjustment circuit 1000 of the first embodiment. If the number of trials is reduced, it is possible to adjust power semiconductor element 1 to the desired characteristics in a shorter period of time.

Figure 5:
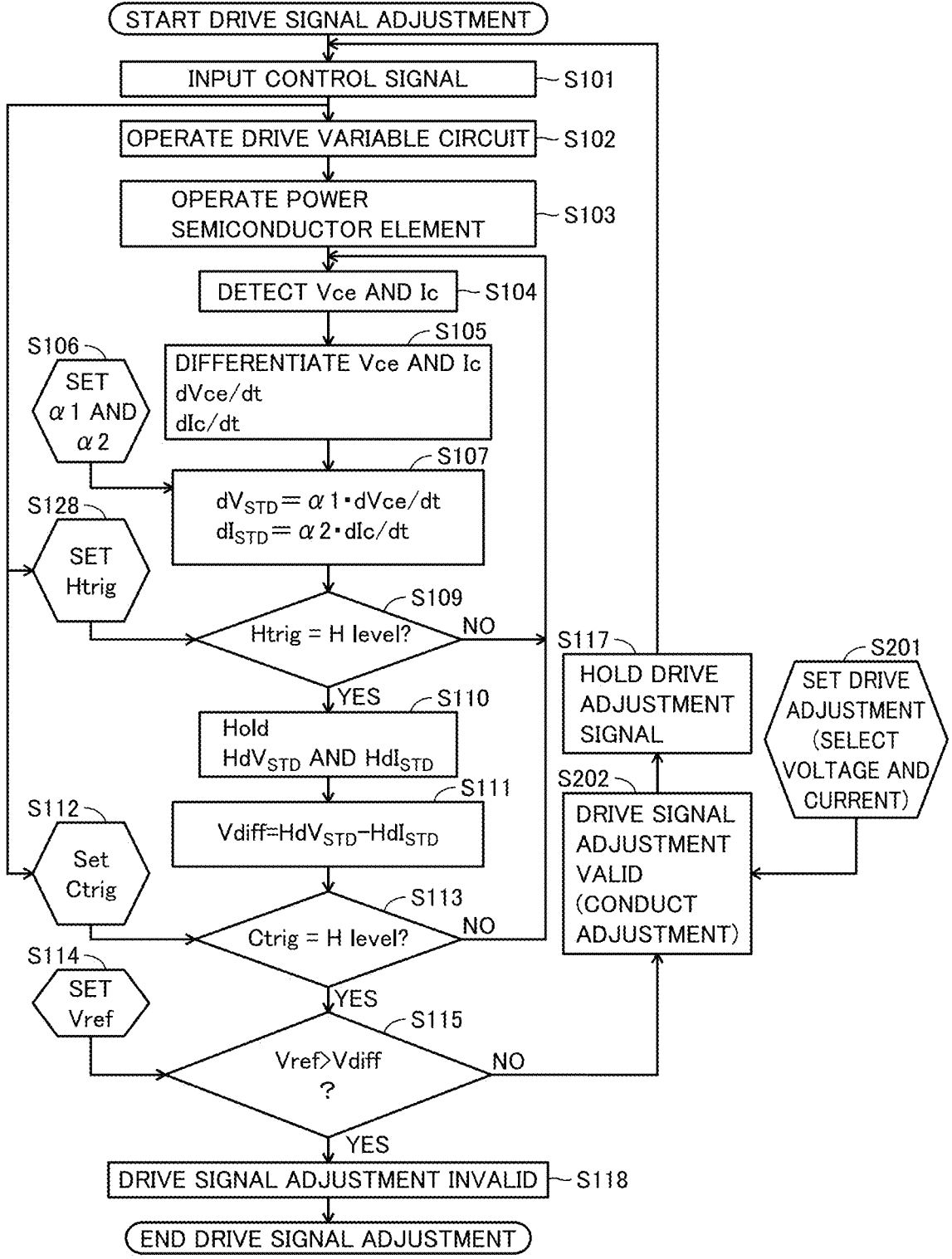
FIG. 5 is a flowchart showing an operation of drive adjustment circuit 2000 of the second embodiment.

FIG. 5 is a flowchart showing an operation of drive adjustment circuit 2000 of the second embodiment. The point in which the flowchart of FIG. 5 is different from the flowchart of the first embodiment shown in FIG. 3 is that the flowchart of FIG. 5 includes step S201.

In step S201, drive adjustment setting unit 83 selects, as the characteristic to be adjusted, either one of the voltage change (dVce/dt) in the collector-emitter voltage of power semiconductor element 1 or the current change (dIc/dt) in the collector current thereof.

In step S202, drive adjustment unit 81 generates the drive adjustment signal for adjusting the drive signal of drive variable circuit 9 so that the selected characteristic is adjusted.

As described above, drive adjustment circuit 2000 of the second embodiment sets the one to be adjusted from the voltage change (dVce/dt) in the collector-emitter voltage of power semiconductor element 1 and the current change (dIc/dt) in the collector current of power semiconductor element 1. As a result, compared with drive adjustment circuit 1000 of the first embodiment, drive adjustment circuit 2000 of the second embodiment can reduce the number of trials for adjusting the drive signal. Therefore, it is possible to adjust power semiconductor element 1 to the desired characteristic in a shorter period of time.

Third Embodiment

Figure 6:
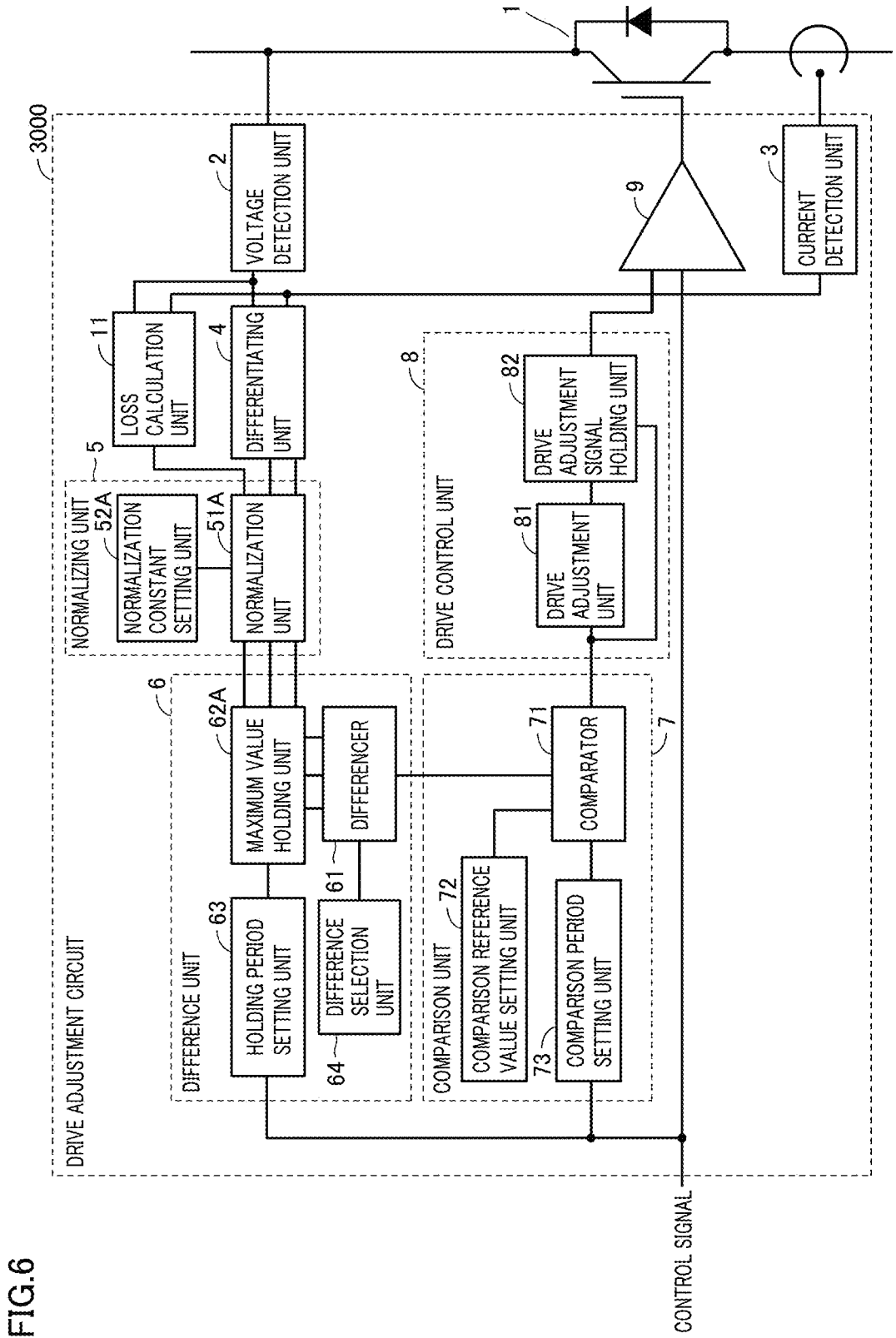
FIG. 6 is a diagram showing a configuration of a drive adjustment circuit 3000 of power semiconductor element 1 according to a third embodiment.

FIG. 6 is a diagram showing a configuration of a drive adjustment circuit 3000 of power semiconductor element 1 according to a third embodiment. The difference between drive adjustment circuit 3000 shown in FIG. 6 and drive adjustment circuit 1000 of the first embodiment shown in FIG. 1 is as follows.

Drive adjustment circuit 3000 in FIG. 6 is provided with a loss calculation unit 11. On the basis of collector-emitter voltage Vce of power semiconductor element 1 detected by voltage detection unit 2 and collector current Ic of power semiconductor element 1 detected by current detection unit 3, loss calculation unit 11 calculates a switching loss generated in power semiconductor element 1.

In addition to the function of the first embodiment, normalizing unit 5 of drive adjustment circuit 3000 in FIG. 6 normalizes the switching loss.

In addition to the function of the first embodiment, a normalization constant setting unit 52A of normalizing unit 5 sets a normalization constant $\alpha 3$. In addition to the function of the first embodiment, a normalization unit 51A of normalizing unit 5 normalizes the switching loss on the basis of normalization constant $\alpha 3$.

In addition to the function of the first embodiment, a maximum value holding unit 62A of difference unit 6 further holds a maximum value of the normalized loss value during the holding period set by holding period setting unit 63.

Difference unit 6 of drive adjustment circuit 3000 in FIG. 6 is further provided with a difference selection unit 64.

Difference selection unit 64 of difference unit 6 selects values to be calculated in differencer 61 from among three values held by maximum value holding unit 62A (the maximum value of the normalized loss, the maximum value of the normalized voltage change (dVce/dt) in the collector-emitter voltage of power semiconductor element 1, and the maximum value of the normalized current change (dIc/dt) in the collector current of power semiconductor element 1). Differencer 61 calculates the difference value between two values that are selected.

As an example, when the difference selection unit 64 selects the normalized loss value and the normalized voltage change (dVce/dt) in the collector-emitter voltage of power semiconductor element 1, differencer 61 outputs the difference value between the two values. In this manner, difference selection unit 64 can arbitrarily select the value to be calculated by differencer 61. A different value can be selected for each of the turn-on operation and the turn-off operation as the value that is selected by difference selection unit 64 to be calculated by differencer 61.

Comparison unit 7, drive control unit 8, and drive variable circuit 9 are the same as those of drive adjustment circuit 1000 of the first embodiment.

When difference selection unit 64 selects the normalized loss value, drive control unit 8 outputs the drive adjustment signal for controlling the drive signal for power semiconductor element 1 on the basis of a comparison result between a difference result between the normalized loss value and the other selected value and the comparison reference value set by comparison reference value setting unit 72. In drive adjustment circuit 3000 of the third embodiment, since difference selection unit 64 selects the normalized loss, drive control unit 8 can control the drive signal for power semiconductor element 1 in such a manner as to directly reduce the loss value. Therefore, a loss reduction effect can be enhanced as compared with drive adjustment circuit 1000 of the first embodiment.

Figure 7:
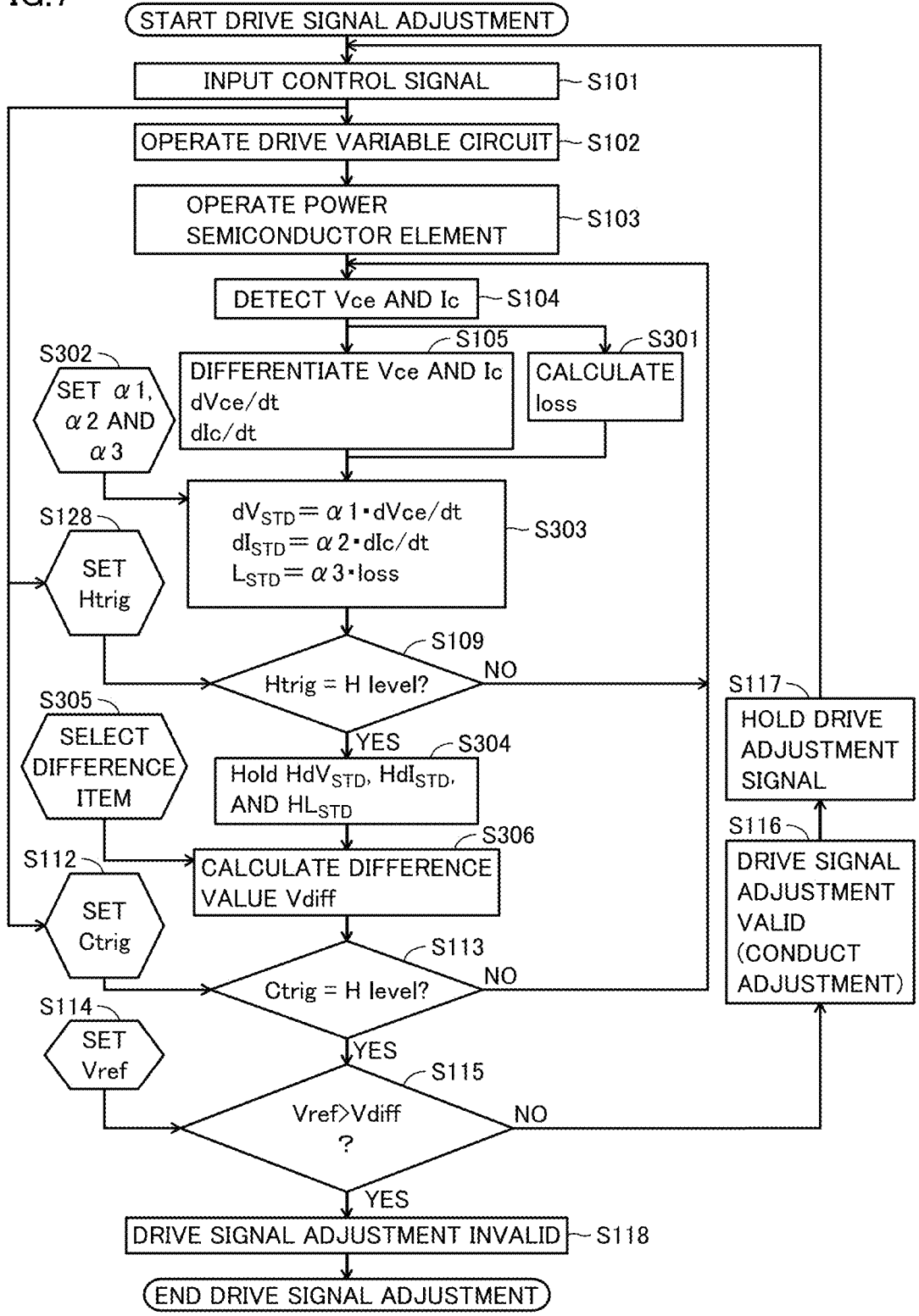
FIG. 7 is s a flowchart showing an operation of drive adjustment circuit 3000 of the third embodiment.

FIG. 7 is a flowchart showing an operation of drive adjustment circuit 3000 of the third embodiment. The point in which the flowchart of FIG. 7 is different from the flowchart of the first embodiment of FIG. 3 is as follows.

In step S301, loss calculation unit 11 calculates the switching loss (loss), which is generated in power semiconductor element 1, from collector-emitter voltage Vce of power semiconductor element 1 detected by voltage detection unit 2 and collector current Ic of power semiconductor element 1 detected by current detection unit 3.

In step S302, normalization constant setting unit 52 sets normalization constant $\alpha 3$ in addition to normalization constants $\alpha 1$ and $\alpha 2$.

In step S303, normalization unit 51 normalizes the switching loss (loss) on the basis of normalization constant $\alpha 3$ as described below so as to output a normalized loss LSTD, in addition to the normalization of the differential value (dVce/dt) and the differential value (dIc/dt).

$$LSTD = \alpha 3 \cdot \text{loss} \ldots \quad (3)$$

In step S304, maximum value holding unit 62 of difference unit 6 holds a maximum value of the normalized loss LSTD as HLSTD, in addition to the holding of the maximum value HdVSTD of dVSTD and the maximum value HdISTD of dISTD when holding period setting signal Htrig set by holding period setting unit 63 is valid.

In step S305, difference selection unit 64 selects two values from among the three values held in maximum value holding unit 62 (the maximum value of the normalized loss, the maximum value of the normalized voltage change (dVce/dt) in the collector-emitter voltage of power semiconductor element 1, and the maximum value of the normalized current change (dIc/dt) in the collector current of power semiconductor element 1).

In step S306, differencer 61 outputs the difference value between the two selected values.

As described above, according to the third embodiment, it is possible to arbitrarily select the values to be calculated by differencer 61, which are selected in difference selection unit 64, for the turn-on operation and the turn-off operation. By selecting the normalized loss value in difference selection unit 64, the loss reduction effect can be enhanced as compared with drive adjustment circuit 1000 of the first embodiment.

Fourth Embodiment

Figure 8:
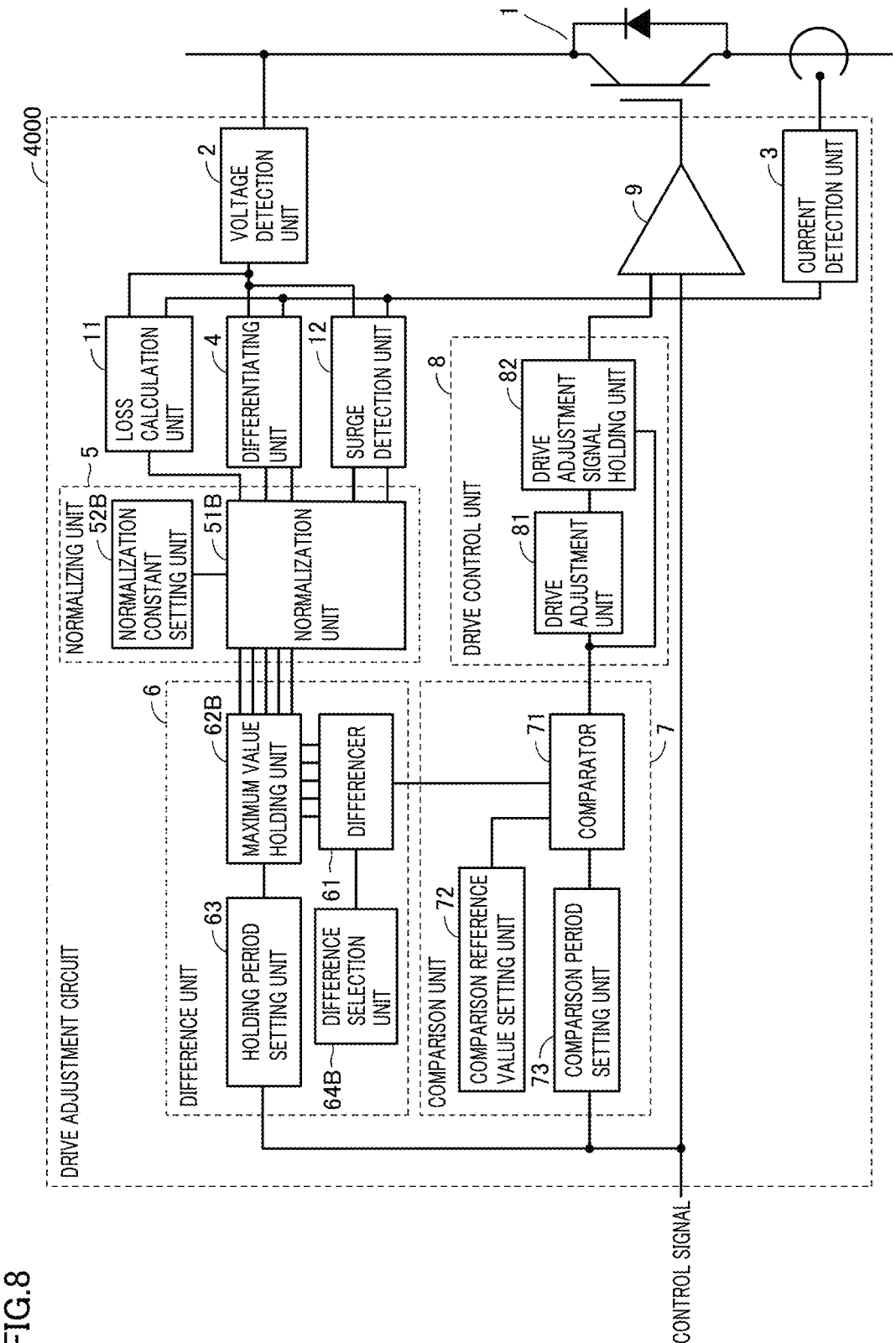
FIG. 8 is a diagram showing a configuration of a drive adjustment circuit 4000 of power semiconductor element 1 according to a fourth embodiment.

FIG. 8 is a diagram showing a configuration of a drive adjustment circuit 4000 of power semiconductor element 1 according to a fourth embodiment. The difference between drive adjustment circuit 4000 shown in FIG. 8 and drive adjustment circuit 3000 of the third embodiment shown in FIG. 6 is as follows.

Drive adjustment circuit 4000 in FIG. 8 is provided with a surge detection unit 12.

Surge detection unit 12 detects a surge current of the collector current of power semiconductor element 1 detected by current detection unit 3 at the time of the turn-on operation, and a surge voltage of the collector-emitter voltage of power semiconductor element 1 detected by voltage detection unit 2 at the time of the turn-off operation.

In addition to the function of the third embodiment, normalizing unit 5 of drive adjustment circuit 4000 in FIG. 8 normalizes the surge current and the surge voltage.

In addition to the function of the third embodiment, a normalization constant setting unit 52B of normalizing unit 5 sets normalization constants α4 and α5. In addition to the function of the third embodiment, a normalization unit 51B of normalizing unit 5 normalizes the surge current on the basis of normalization constant α4 and normalizes the surge voltage on the basis of normalization constant α5.

In addition to the function of the third embodiment, a maximum value holding unit 62B of difference unit 6 holds a maximum value of the normalized surge current and a maximum value of the normalized surge voltage during the holding period set by holding period setting unit 63.

A difference selection unit 64B of difference unit 6 selects two values to be calculated by differencer 61 from among five values held by maximum value holding unit 62B (the maximum value of the normalized surge current of the collector current of power semiconductor element 1 at the time of the turn-on operation, the maximum value of the normalized surge voltage of the collector-emitter voltage of power semiconductor element 1 at the time of the turn-off operation, the maximum value of the normalized loss, the maximum value of the normalized voltage change (dVce/dt) in the collector-emitter voltage of power semiconductor element 1, and the maximum value of the normalized current change (dIc/dt) in the collector current of power semiconductor element 1). In this manner, difference selection unit 64B can arbitrarily select the two values to be calculated by differencer 61. Different values can be selected for the turn-on operation and the turn-off operation, respectively, as the two values that are selected by difference selection unit 64B to be calculated by differencer 61. Differencer 61 calculates the difference value between the two selected values.

Comparison unit 7, drive control unit 8, and drive variable circuit 9 are the same as those of drive adjustment circuit 3000 of the third embodiment.

For example, when difference selection unit 64B selects the maximum value of the normalized surge voltage or the maximum value of the normalized surge current, drive control unit 8 outputs the drive adjustment signal for controlling the drive signal for power semiconductor element 1 on the basis of the comparison result between the difference result from the other selected value and the comparison reference value set by comparison reference value setting unit 72. In other words, in the fourth embodiment, difference selection unit 64B selects the maximum value of the normalized surge voltage at the time of the turn-off, and selects the maximum value of the normalized surge current at the time of the turn-on. Thereby, compared with drive adjustment circuit 3000 of the third embodiment, the surge current at the time of the turn-on and the surge voltage at the time of the turn-off can be reduced. As a result, it is possible to suppress breakage of power semiconductor element 1, which is caused by the surge current or the surge voltage.

Figure 9:
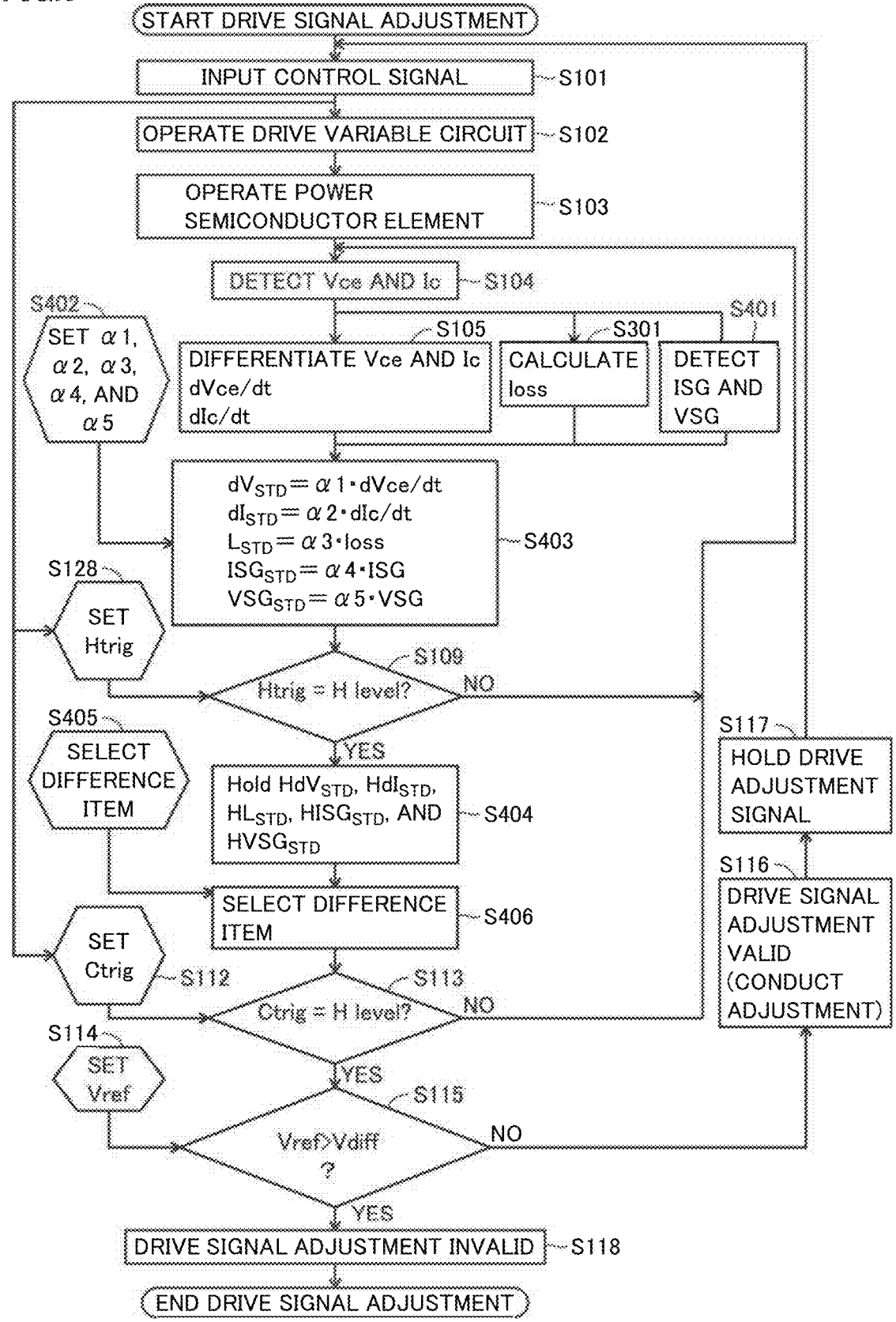
FIG. 9 is a flowchart showing an operation of drive adjustment circuit 4000 of the fourth embodiment.

FIG. 9 is a flowchart showing an operation of drive adjustment circuit 4000 of the fourth embodiment. The point in which the flowchart of FIG. 9 is different from the flowchart of the third embodiment of FIG. 7 is as follows.

In step S401, surge detection unit 12 detects a surge current ISG of the collector current of power semiconductor element 1 detected by current detection unit 3 at the time of the turn-on and a surge voltage VSG of the collector-emitter voltage of power semiconductor element 1 detected by voltage detection unit 2 at the time of the turn-off.

In step S402, in addition to the setting of normalization constants α1, α2 and α3, normalization constant setting unit 52B of normalizing unit 5 sets normalization constants α4 and α5.

In step S403, in addition to the normalization of the differential value (dVce/dt), the differential value (dIc/dt), and the switching loss (loss), normalization unit 51 normalizes detected surge current ISG and surge voltage VSG, and outputs a normalized surge current ISGSTD and a normalized surge voltage VSGSTD as follows.

$$ISGSTD = \alpha 4 \cdot ISG \ldots \quad (4)$$

$$VSGSTD = \alpha 5 \cdot VSG \ldots \quad (5)$$

In step S404, maximum value holding unit 62B of difference unit 6 holds a maximum value HISGSTD of normalized surge current ISGSTD and holds a maximum value HVSGSTD of normalized surge voltage VSGSTD in addition to the holding of maximum value HdVSTD of dVSTD, maximum value HdISTD of dISTD, and maximum value HLSTD of LSTD when holding period setting signal Htrig set by holding period setting unit 63 is valid.

In step S405, difference selection unit 64B arbitrarily selects the values to be calculated by differencer 61.

In step S406, differencer 61 outputs the difference value between the two selected values.

As described above, according to the fourth embodiment, the values to be calculated by differencer 61 that are selected by difference selection unit 64 can be arbitrarily set for the turn-on operation and the turn-off operation. When difference selection unit 64 selects the normalized surge current in the turn-on operation and the normalized surge voltage in the turn-off operation, it is possible to reduce the surge current at the time of the turn-on and the surge voltage at the time of the turn-off so as to suppress breakage of power semiconductor element 1 that is caused by the surge current or the surge voltage.

Fifth Embodiment

Figure 10:
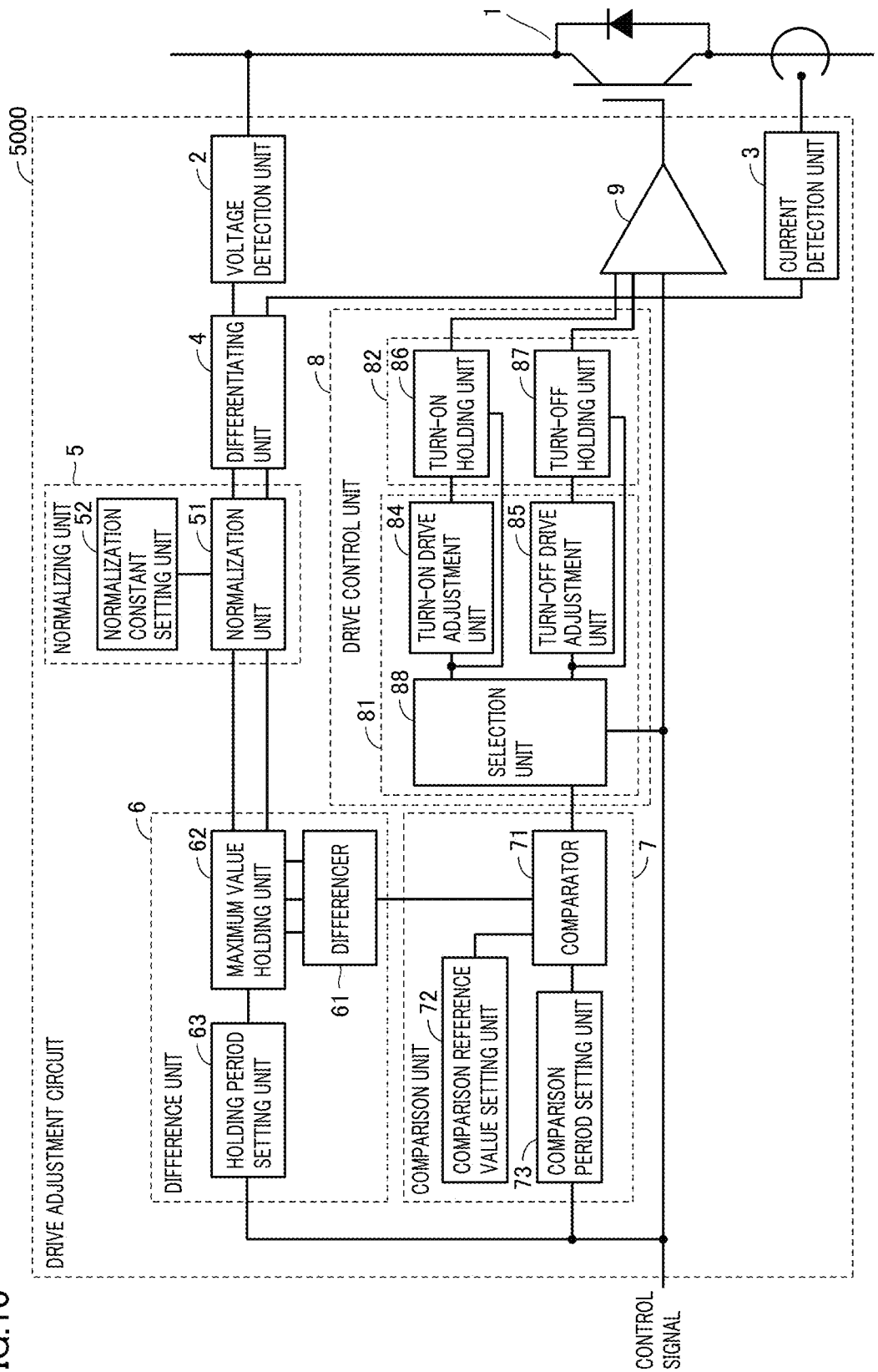
FIG. 10 is a diagram showing a configuration of a drive adjustment circuit 5000 of power semiconductor element 1 according to a fifth embodiment.

FIG. 10 is a diagram showing a configuration of a drive adjustment circuit 5000 of power semiconductor element 1 according to a fifth embodiment. The difference between drive adjustment circuit 5000 shown in FIG. 10 and drive adjustment circuit 1000 of the first embodiment shown in FIG. 1 is as follows.

Drive adjustment unit 81 of drive control unit 8 of drive adjustment circuit 5000 of FIG. 10 is provided with a selection unit 88, a turn-on drive adjustment unit 84, and a turn-off drive adjustment unit 85. Drive adjustment signal holding unit 82 is provided with a turn-on holding unit 86 and a turn-off holding unit 87.

Drive adjustment circuit 1000 of the first embodiment controls either one of the turn-on operation or the turn-off operation of power semiconductor element 1.

Selection unit 88 selects the turn-on operation or the turn-off operation on the basis of the control signal.

Turn-on drive adjustment unit 84 outputs a drive adjustment signal for controlling the drive signal in the turn-on operation of power semiconductor element 1 in accordance with the comparison result of comparison unit 7 when the turn-on operation is selected by selection unit 88. Turn-on holding unit 86 holds the drive adjustment signal output from turn-on drive adjustment unit 84 when the drive adjustment in turn-on drive adjustment unit 84 is valid.

Turn-off drive adjustment unit 85 outputs a drive adjustment signal for controlling the drive signal in the turn-off operation of power semiconductor element 1 in accordance with the comparison result of the comparison unit 7 when the turn-off operation is selected by the selection unit 88. Turn-off holding unit 87 holds the drive adjustment signal output from turn-off drive adjustment unit 85 when the drive adjustment in turn-off drive adjustment unit 85 is valid.

Figure 11:
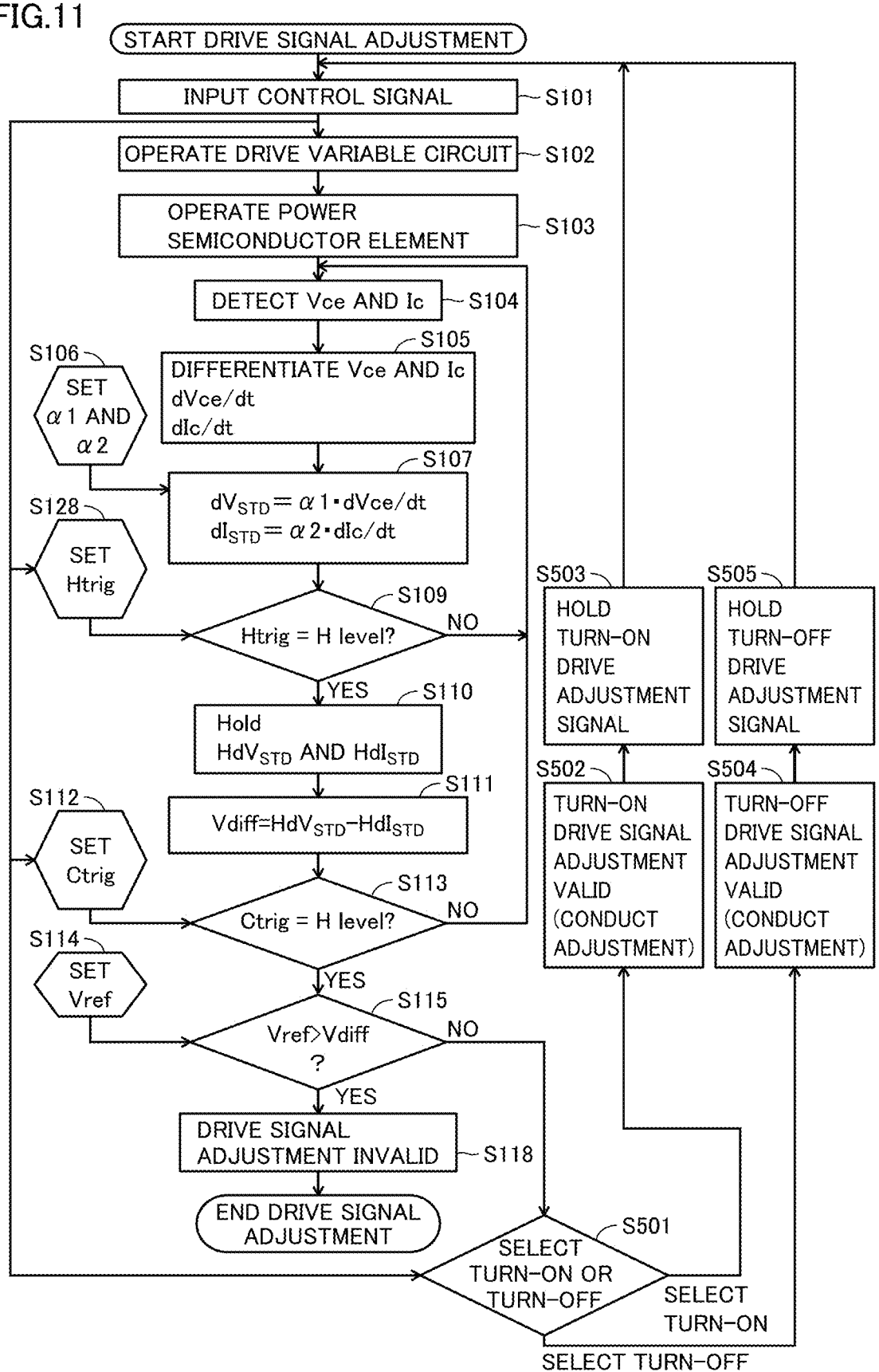
FIG. 11 is a flowchart showing an operation of drive adjustment circuit 5000 of the fifth embodiment.

FIG. 11 is a flowchart showing an operation of drive adjustment circuit 5000 of the fifth embodiment. The point in which the flowchart of FIG. 11 is different from the flowchart of the first embodiment shown in FIG. 3 is as follows.

In step S115, when comparison reference value Vref<difference value Vdiff, the process proceeds to step S501.

In step S501, selection unit 88 selects the turn-on operation or the turn-off operation on the basis of the control signal. When the turn-on operation is selected, the process proceeds to step S502. When the turn-off operation is selected, the process proceeds to step S504.

In step S502, turn-on drive adjustment unit 84 outputs the drive adjustment signal for adjusting the drive signal in the turn-on operation.

In step S503, turn-on holding unit 86 holds the drive adjustment signal in the turn-on operation.

In step S504, turn-off drive adjustment unit 85 outputs the drive adjustment signal for adjusting the drive signal in the turn-off operation.

In step S505, turn-off holding unit 87 holds the drive adjustment signal in the turn-off operation.

As described above, according to the fifth embodiment, while obtaining the same effect of reducing both the loss and the noise as in the first embodiment, when power semiconductor element 1 is operated continuously, it is possible to reduce the loss and the noise of power semiconductor element 1 in both of the operations of the turn-on and the turn-off by controlling the drive signals in the turn-on operation and the turn-off operation on the basis of the selection result of selection unit 88.

Sixth Embodiment

Figure 12:
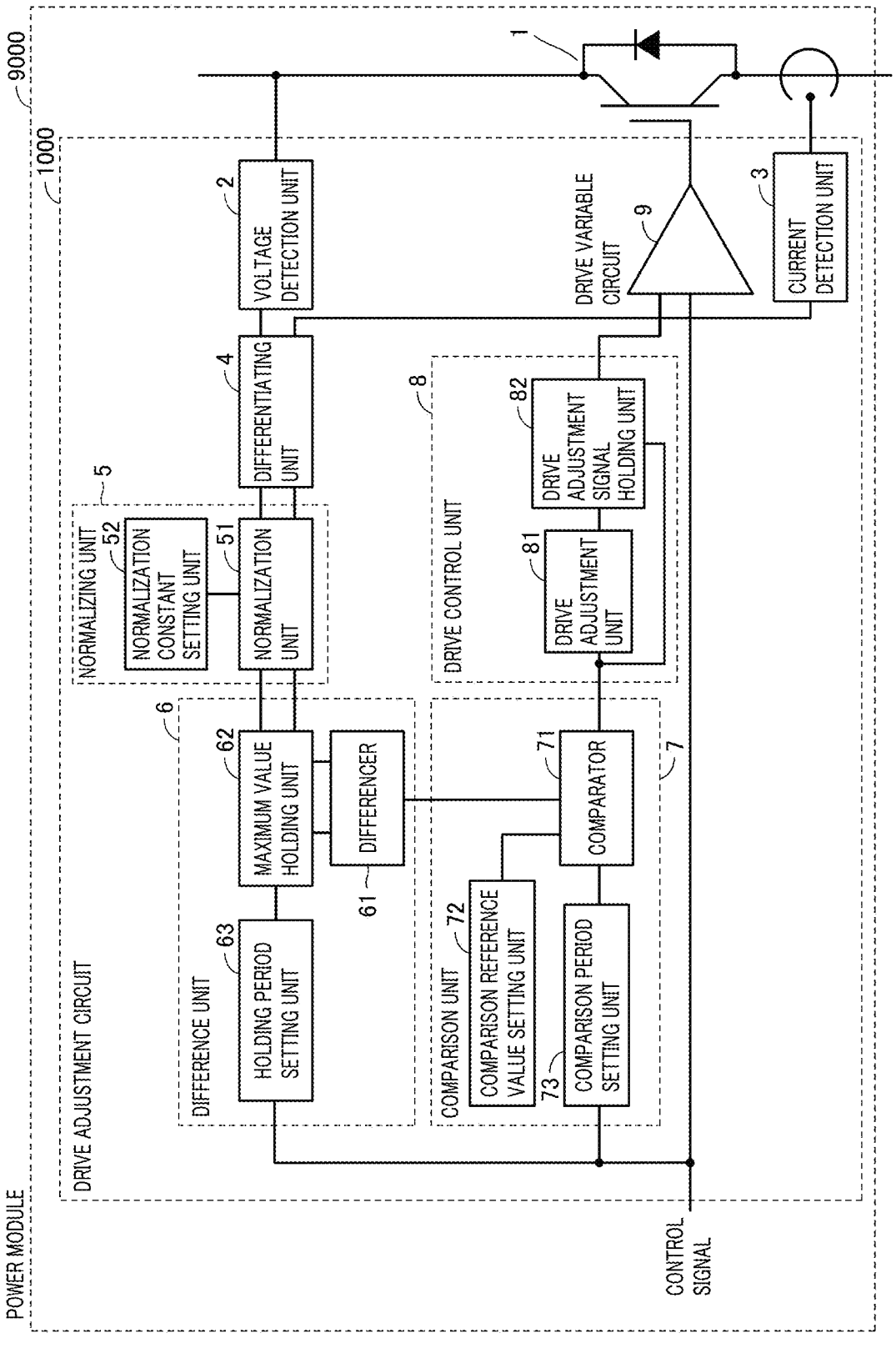
FIG. 12 is a diagram showing a configuration of a power module 9000 of a sixth embodiment.

FIG. 12 is a diagram showing a configuration of a power module 9000 of a sixth embodiment.

Power module 9000 is provided with power semiconductor element 1 and drive adjustment circuit 1000 of the first embodiment. Power module 9000 may be provided with drive adjustment circuits 2000 to 5000 of second to fifth embodiments in place of drive adjustment circuit 1000.

The power module 9000 may be provided with, for example, six power semiconductor elements instead of being provided with only one power semiconductor element 1.

Seventh Embodiment

The present embodiment is obtained by applying drive adjustment circuits 1000 to 5000 of the first to fifth embodiments described above to a power conversion device. Although the present disclosure is not limited to a specific power conversion device, a case in which the present disclosure is applied to a three-phase inverter will be described below as a seventh embodiment.

Figure 13:
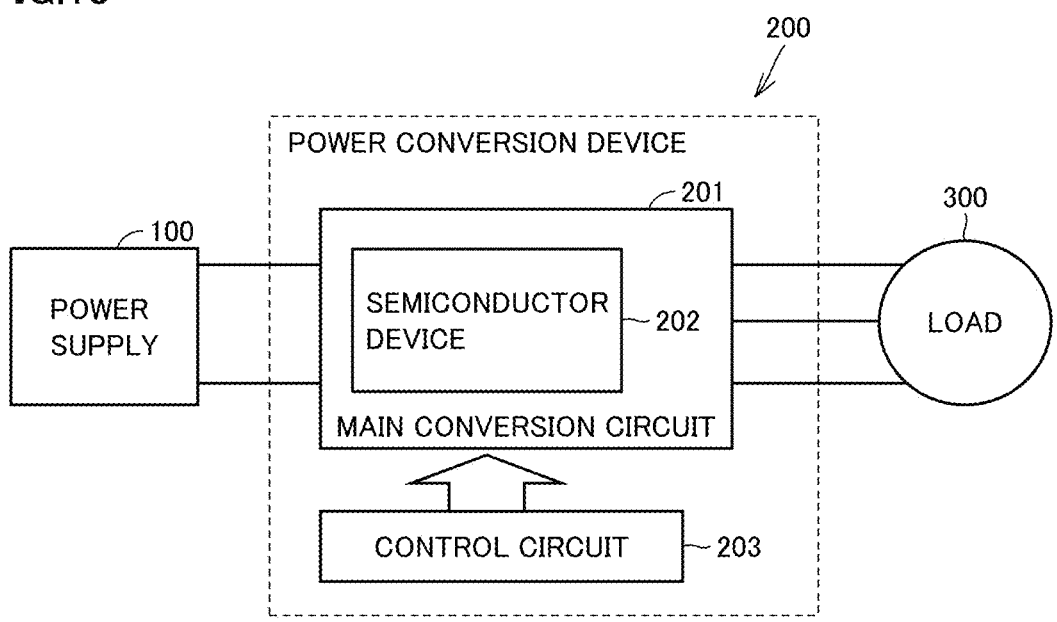
FIG. 13 is a block diagram showing a configuration of a power conversion system of a seventh embodiment.

FIG. 13 is a block diagram showing a configuration of a power conversion system of the seventh embodiment.

The power conversion system is provided with a power supply 100, a power conversion device 200, and a load 300.

Power supply 100 is a DC power supply. Power supply 100 supplies a DC power to power conversion device 200. Power supply 100 can be composed of various members. For example, power supply 100 can be composed of a DC system, a solar battery, or a storage battery, or may be composed of a rectifier circuit or an AC/DC converter connected to an AC system. Power supply 100 may be composed of a DC/DC converter that converts a DC power output from a DC system into a predetermined power.

Power conversion device 200 is the three-phase inverter connected between power supply 100 and load 300. Power conversion device 200 converts the DC power supplied from power supply 100 into the AC power so as to supply the AC power to load 300. Power conversion device 200 is provided with a main conversion circuit 201 that converts the DC power into the AC power for outputting, and a control circuit 203 that outputs, to main conversion circuit 201, a control signal for controlling main conversion circuit 201.

Load 300 is a three-phase electric motor driven by the AC power supplied from power conversion device 200. Load 300 is not limited to a specific application, but is the electric motor mounted on any of various types of electrical instruments. For example, load 300 is used as the electric motor for a hybrid vehicle, an electric vehicle, a railroad car, an elevator, or an air conditioner.

Details of power conversion device 200 will be described below.

Main conversion circuit 201 is provided with a switching element and a reflux diode (not shown).

When the switching element performs switching, the DC power supplied from power supply 100 is converted into the AC power and supplied to load 300. Although there are various specific circuit configurations of main conversion circuit 201, main conversion circuit 201 according to the present embodiment is a two-level three-phase full bridge circuit. The two-level three-phase full-bridge circuit is provided with six switching elements and six reflux diodes anti-parallel to the respective switching elements. Every two switching elements of the six switching elements are connected in series to form upper and lower arms, and each of the upper and lower arms forms each phase (a U phase, a V phase, a W phase) of the full bridge circuit. Then, output terminals of each of the upper and lower arms, that is, three output terminals of main conversion circuit 201 are connected to load 300.

Each of the switching elements of main conversion circuit 201 is power semiconductor element 1 in the first to fifth embodiments described above.

As described in the first to fifth embodiments described above, since drive adjustment circuits 1000 to 5000 for driving the respective switching elements (power semiconductor elements 1) are built in semiconductor device 202, main conversion circuit 201 is provided with drive adjustment circuits 1000 to 5000.

The drive adjustment circuit generates a drive signal for driving the switching element of main conversion circuit 201, and supplies the drive signal to a control electrode of the switching element of main conversion circuit 201. Specifically, in accordance with the control signal from control circuit 203, which will be described later, the drive adjustment circuit outputs a drive signal for turning the switching element into an ON state and a drive signal for turning the switching element into an OFF state to the control electrode of each of the switching elements. When the switching element is maintained in the ON state, the drive signal is a voltage signal (an ON signal) that has a threshold voltage of the switching element or more, and when the switching element is maintained in the OFF state, the drive signal is a voltage signal (an OFF signal) that has less than the threshold voltage of the switching element.

Control circuit 203 controls the switching elements of main conversion circuit 201 so that a desired power is supplied to load 300. Specifically, a time (an ON time) at which each of the switching elements of main conversion circuit 201 should be in the ON state is calculated on the basis of a power to be supplied to load 300. For example, main conversion circuit 201 can be controlled by PWM control that modulates the ON time of the switching element in accordance with a voltage to be output. Then, a control command (the control signal) is output to the drive adjustment circuit included in main conversion circuit 201 so that the ON signal is output to the switching element that should be in the ON state and the OFF signal is output to the switching element that should be in the OFF state at each point in time. In accordance with the control signal, the drive adjustment circuit outputs the ON signal or the OFF signal as the drive signal to the control electrode of each of the switching elements.

In the power conversion device according to the present embodiment, since main conversion circuit 201 is provided with drive adjustment circuits 1000 to 5000 of the first to fifth embodiments, the loss and the noise of power semiconductor element 1 can be reduced.

Although the example in which the present disclosure is applied to the two-level three-phase inverter has been described in the present embodiment, the present disclosure is not limited to this, and can be applied to various power conversion devices. In the present embodiment, the two-level power conversion device is used, but a three-level or multi-level power conversion device may be used. When the power is supplied to a single-phase load, the present disclosure may be applied to a single-phase inverter. Further, when the power is supplied to a DC load or the like, the present disclosure can also be applied to a DC/DC converter or an AC/DC converter.

The power conversion device to which the present disclosure is applied is not limited to the above-described case in which the load is the electric motor. For example, the power conversion device can be used as a power supply device for an electric discharge machine, a laser processing machine, an induction heating cooking device, and a contactless power supply system. Furthermore, the power conversion device can be used as a power conditioner for a photovoltaic power generation system, an electricity storage system, and the like.

The embodiments disclosed this time are examples in all respects and should not be considered to be restrictive. The scope of the present disclosure is shown by the scope of claims rather than the above-mentioned description, and is intended to include all modifications within the meaning and scope equivalent to the scope of claims.

REFERENCE SIGNS LIST

1 power semiconductor element; 2 voltage detection unit; 3 current detection unit; 4 differentiating unit; 5 normalizing unit; 6 difference unit; 7 comparison unit; 8 drive control unit; 9 drive variable circuit; 11 loss calculation unit; 12 surge detection unit; 51, 51A, 51B normalization unit; 52, 52A, 52B normalization constant setting unit; 61 differencer; 62, 62A, 62B maximum value holding unit; 63 holding period setting unit; 64, 64B difference selection unit; 71 comparator; 72 comparison reference value setting unit; 73 comparison period setting unit; 81 drive adjustment unit; 82 drive adjustment signal holding unit; 83 drive adjustment setting unit; 84 turn-on drive adjustment unit; 85 turn-off drive adjustment unit; 86 turn-on holding unit; 87 turn-off holding unit; 88 selection unit; 100 power supply; 100A current; 200 power conversion device; 201 main conversion circuit; 202 semiconductor device; 203 control circuit; 300 load; 1000, 2000, 3000, 4000, 5000 drive adjustment circuit; 9000 power module

The invention claimed is:

1. A power semiconductor element drive adjustment circuit, comprising:
   a voltage detector to detect a collector-emitter voltage of a power semiconductor element;
   a current detector to detect a collector current of the power semiconductor element;
   a differentiating circuit to differentiate the collector-emitter voltage and differentiate the collector current;
   a normalizer to normalize a differential value of the collector-emitter voltage and normalize a differential value of the collector current;
   a difference circuit to calculate a difference value between a normalized value of the differential value of the collector-emitter voltage and a normalized value of the differential value of the collector current;
   a comparison circuit to compare the difference value with a comparison reference value;
   a drive controller to generate, on the basis of a comparison result of the comparison circuit, a drive adjustment signal for adjusting a drive signal for the power semiconductor element; and
   a drive variable circuit to output, on the basis of the drive adjustment signal, the drive signal for the power semiconductor element.

2. The power semiconductor element drive adjustment circuit according to claim 1, wherein the normalizer includes:
a normalization constant setter to set a first normalization constant and a second normalization constant; and
a normalization circuit to normalize the differential value of the collector-emitter voltage on the basis of the first normalization constant and normalize the differential value of the collector current on the basis of the second normalization constant.

3. The power semiconductor element drive adjustment circuit according to claim 1, wherein the difference circuit includes:
a maximum value holder to hold a maximum value of a normalized differential value of the collector-emitter voltage and hold a maximum value of a normalized differential value of the collector current;
a holding period setter to set a holding period in the maximum value holder; and
a differencer to generate a difference value between the maximum value of the normalized differential value of the collector-emitter voltage held in the maximum value holder and the maximum value of the normalized differential value of the collector current held in the maximum value holder.

4. The power semiconductor element drive adjustment circuit according to claim 1, wherein the comparison circuit includes:
a comparison reference value setter to set the comparison reference value;
a comparator to compare the difference value with the comparison reference value; and
a comparison period setter to set a period during which a comparison is made in the comparator.

5. The power semiconductor element drive adjustment circuit according to claim 1, wherein the drive controller includes:
a drive adjuster to generate a drive adjustment signal for adjusting the drive signal for the power semiconductor element in accordance with the comparison result of the comparison circuit; and
a drive adjustment signal holder to hold and output the drive adjustment signal generated by the drive adjuster in accordance with the comparison result of the comparison circuit.

6. The power semiconductor element drive adjustment circuit according to claim 1, wherein the drive controller:
includes a drive adjustment setter to set a change amount to be adjusted from a change amount per unit time of the collector-emitter voltage of the power semiconductor element and a change amount per unit time of the collector current of the power semiconductor element; and
outputs, on the basis of the setting of the drive adjustment setter, the adjusted drive adjustment signal in accordance with the comparison result of the comparison circuit.

7. The power semiconductor element drive adjustment circuit according to claim 1, further comprising a loss calculator to calculate a loss of the power semiconductor element, wherein:
the normalizer further normalizes the loss of the power semiconductor element; and
the difference circuit calculates a difference value between any two from among the normalized differential value of the collector-emitter voltage, the normalized differential value of the collector current, and a normalized loss of the power semiconductor element.

8. The power semiconductor element drive adjustment circuit according to claim 1, further comprising a surge detector that is connected to the voltage detector and the current detector so as to detect a surge voltage of the power semiconductor element and a surge current of the power semiconductor element, wherein:
the normalizer normalizes the surge voltage of the power semiconductor element and normalizes the surge current of the power semiconductor element; and
the difference circuit calculates a difference value between any two from among the normalized differential value of the collector-emitter voltage, the normalized differential value of the collector current, the normalized loss of the power semiconductor element, a normalized surge voltage of the power semiconductor element, and a normalized surge current of the power semiconductor element.

9. The power semiconductor element drive adjustment circuit according to claim 1, wherein:
the drive adjuster of the drive controller includes:
a selector to select a driving signal to be adjusted from a driving signal in a turn-on operation of the power semiconductor element and a drive signal in a turn-off operation of the power semiconductor element;
a turn-on drive adjuster to adjust the drive signal for the turn-on operation of the power semiconductor element when adjusting the drive signal in the turn-on operation of the power semiconductor element is selected by the selector; and
a turn-off drive adjuster to adjust the drive signal for the turn-off operation of the power semiconductor element when adjusting the drive signal in the turn-off operation of the power semiconductor element is selected by the selector, and
the drive adjustment signal holder of the drive controller includes:
a turn-on holder to hold and output a drive adjustment signal adjusted by the turn-on drive adjuster in accordance with the comparison result of the comparison circuit; and
a turn-off holder to hold and output a drive adjustment signal adjusted by the turn-off drive adjuster in accordance with the comparison result of the comparison circuit.

10. A power module comprising a power semiconductor element, and the power semiconductor element drive adjustment circuit according to claim 1.

11. A power conversion device, comprising:
a main conversion circuit that includes a power semiconductor element and the power semiconductor element drive adjustment circuit according to claim 1, to convert and output inputted power; and
a control circuit to output, to the main conversion circuit, a control signal for controlling the main conversion circuit.

* * * * *